United States Patent
Young et al.

(10) Patent No.: US 7,075,332 B1
(45) Date of Patent: Jul. 11, 2006

(54) SIX-INPUT LOOK-UP TABLE AND ASSOCIATED MEMORY CONTROL CIRCUITRY FOR USE IN A FIELD PROGRAMMABLE GATE ARRAY

(75) Inventors: Steven P. Young, Boulder, CO (US); Venu M. Kondapalli, Sunnyvale, CA (US); Ramakrishna K. Tanikella, Boulder, CO (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/863,989

(22) Filed: Jun. 8, 2004

(51) Int. Cl.
*G06F 7/38* (2006.01)
*H03K 10/173* (2006.01)
*H03K 19/177* (2006.01)
*H01L 25/00* (2006.01)

(52) U.S. Cl. .......................... 326/38; 326/37; 326/39; 326/40; 326/41; 326/46; 326/47; 706/50; 716/16

(58) Field of Classification Search ............ 326/37–41, 326/46, 47; 706/50; 716/16
See application file for complete search history.

(56) References Cited

U.S. PATENT DOCUMENTS

| | | |
|---|---|---|
| 6,400,180 B1 | 6/2002 | Wittig et al. |
| 6,407,576 B1 | 6/2002 | Ngai et al. |
| 6,556,042 B1 | 4/2003 | Kaviani |
| 6,621,298 B1 | 9/2003 | Agrawal et al. |
| 6,667,635 B1 | 12/2003 | Pi et al. |
| 2001/0043082 A1* | 11/2001 | Wittig et al. ................... 326/39 |
| 2005/0146352 A1* | 7/2005 | Madurawe ..................... 326/41 |

OTHER PUBLICATIONS

U.S. Appl. No. 10/864,024, filed Jun. 8, 2004, Young et al.
U.S. Appl. No. 10/864,244, filed Jun. 8, 2004, Young et al.
U.S. Appl. No. 10/639,874, filed Aug. 12, 2003, New et al.
Altera Corcporation; "Stratix II Device Family Data Sheet"; v1.0; published Feb. 2004; available from Altera Corporation, 101 Innovation Drive, San Jose, CA 95134; p. 2-1 through 2-22.

(Continued)

*Primary Examiner*—Rexford Barnie
*Assistant Examiner*—Dylan White
(74) *Attorney, Agent, or Firm*—E. Eric Hoffman; Lois D. Cartier

(57) ABSTRACT

A 6-input LUT architecture includes 64 memory cells, which store 64 corresponding data values. Sixty-four write control circuits are coupled to the 64 memory cells. A first write address decoder receives a first subset of the six input signals, and in response, provides a first set of write select signals to the 64 write control circuits. A second write address decoder receives a second subset of the six input signals and a write clock signal, and in response, provides a plurality of decoded write clock signals to the sixty-four write control circuits. A write data value, which is applied to each of the write control circuits, is written to one of the memory cells in a synchronous manner with respect to the write clock signal in response to the first set of write select signals and the decoded write clock signals.

11 Claims, 14 Drawing Sheets

OTHER PUBLICATIONS

Ralf Krueger and Brent Przybus; WP209 (v1.0); "Virtex Variable-Input LUT Architecture"; Jan. 12, 2004; available from Xilinx, Inc., 2100 Logic Drive, San Jose, California 95124; p. 1-6.

Xilinx, Inc.; "Virtex-II Platform FPGA Handbook"; published Dec. 2000; available from Xilinx, Inc., 2100 Logic Drive, San Jose, California 95124; pp. 46-53.

Anthony Cataldo and Ron Wilson; "FPGA vendors revise logic for sub-100-nm era"; EE Times; Feb. 2, 2004; downloaded from http://www.eetimes.com/story/OEG20040202S0019; pp. 1-4.

Xilinx, Inc.; "The Programmable Logic Data Book 1994"; published 1994; available from Xilinx, Inc., 2100 Logic Drive, San Jose, California 95124; pp. 2-110 thru 2-111.

* cited by examiner

US 7,075,332 B1

SIX-INPUT LOOK-UP TABLE AND ASSOCIATED MEMORY CONTROL CIRCUITRY FOR USE IN A FIELD PROGRAMMABLE GATE ARRAY

FIELD OF THE INVENTION

The present invention relates to the practical application of a 6-input lookup table (LUT) in a programmable logic device, such as a field programmable gate array (FPGA).

RELATED ART

Field programmable gate arrays (FPGAs) consist of repeated blocks of logic called configurable logic blocks (CLBs), which can be programmed to perform as a specific combinational or sequential circuit. In addition, FPGAs typically include other specialized blocks, such as block random access memories (BRAMs) and digital signal processors (DSPs). These specialized blocks perform more specific tasks than the CLBs, but can still be configured in accordance with a variety of options to enable flexible operation of the FPGA. FPGAs also include input/output blocks (IOBs), which contain circuitry that facilitates the transfer of signals to and from input/output (IO) pads of the FPGA. FPGAs can also include other blocks, such as digital clock modules (DCMs), which contain circuitry required to manipulate clock signals. An FGPA programmed to implement a certain circuit uses a combination of some or all of these blocks. In addition to these various blocks, a programmable routing structure is provided throughout the FPGA to ensure connectivity between all of these blocks in order to make a circuit.

CLBs typically contain blocks of programmable logic, called look up tables (LUTs), which can be programmed to implement a combinational logic function. A 4-input LUT, for example, can implement any combinational logic function of 4 inputs. Since LUTs are extensively used in any FPGA, it is very important to choose an appropriate LUT architecture and to ensure that the performance of the LUT is optimal. In addition, LUTs occupy a relatively large area on the FPGA, because the LUTs are repeated so many times. It is therefore important to consider the layout area of a LUT (in addition to the performance of the LUT), when selecting a LUT architecture.

In present-day FPGAs, each LUT can also be programmed to operate as a small random access memory (RAM) or a shift register when used with additional circuitry. The small RAM and shift register functions have become 'must have' features of the LUT, provided that these features are available at a low cost. Conventional LUT functionality is described, for example, at pages 46–53 of the "Virtex-II Platform FPGA Handbook", published December, 2000, available from Xilinx, Inc., 2100 Logic Drive, San Jose, Calif. 95124, which pages are incorporated herein by reference.

As the number of LUT inputs increases, the size of the LUT increases. The last several years, FPGAs have been using, and continue to use, 4-input LUTs. Increasing the number of inputs of the LUT would allow each LUT to implement a greater amount of logic. As a result, the number of LUTs in a critical path should decrease, and the speed of the FPGA should improve. However, the use of a LUT having a larger number of inputs in an FPGA architecture is costly in terms of area.

It would therefore be desirable to have an improved 6-input LUT architecture to enable the practical use of such an architecture in an FPGA.

FIG. 1 is a circuit diagram of a 4-input LUT architecture 100 used in the Virtex™-II family of FPGAs, which are available from Xilinx, Inc., 2100 Logic Drive, San Jose, Calif. 95124. This 4-input LUT 100 includes a 16:1 multiplexer 110 having 4 select lines I1–I4, which provide the four input signals to the LUT. Note that the select lines and the input signals carried by these select lines are both referred to by the same reference numbers, I1–I4. Inverters 111–114 receive the input signals I1–I4, respectively, and in response, provide inverted input signals I1#–I4#, respectively. The sixteen data input terminals of multiplexer 110 are coupled to programmable memory circuits MC0–MC15. Each of memory circuits MC0–MC15 stores a corresponding data value Q0–Q15, respectively.

Each of the input signals I1, I2, I3 and I4 controls a corresponding transmission gate set 101, 102, 103 and 104, respectively. For example, input signal I4 controls the sixteen CMOS transmission gates (G) in set 104, such that the data values stored by the even-numbered memory circuits (i.e., MC0, MC2, MC4, MC6, MC8, MC10, MC12 and MC14) are passed in response to a logic high input signal I4, and the data values stored by the odd-numbered memory cells (i.e., MC1, MC3, MC5, MC7, MC9, MC11, MC13 and MC15) are passed in response to a logic low input signal I4.

In the same way, input signal I3 controls transmission gate set 103 to pass four of the eight data values provided by transmission gate set 104. Similarly, input signal I2 causes transmission gate set 102 to pass two of the four data values provided by transmission gate set 103. Finally, input signal I1 causes transmission gate set 101 to pass one of the two data values provided by transmission gate set 102.

It is important to ensure that the input signals I1–I4 propagate quickly through multiplexer 110, as LUTs tend to be used in many critical paths of an FPGA design, such that any delay in the LUT adversely affects the FPGA performance. It is therefore necessary to insert buffer circuits at several locations within the LUT to pump up the signal strength. For example, in 16:1 multiplexer 110, buffer circuits are placed at two locations within the data path of multiplexer 110. As shown in FIG. 1, buffer circuits (inverters) 121–124 are located between transmission gate sets 102 and 103, and buffer circuit (inverter) 120 is located at the output of multiplexer 110. Although a single buffer circuit 120 is sufficient at the output of multiplexer 110, four buffer circuits 121–124 are required between transmission gate sets 102 and 103 to buffer all possible signal paths to the output of multiplexer 110.

In the above-described 4-input LUT architecture, a change in the input signals I1 or I2 propagates to the output terminal (OUT) faster than a change in the input signals I3 or I4 propagates to the output terminal. There are two main reasons for this.

First, input signals I3 and I4 have to drive substantially more transmission gates than input signals I1 and I2, which means that input signals I3 and I4 may drive a greater load. More importantly, a change in the input signals I3 and I4 has to go through an additional buffer 121, 122, 123 or 124 which slows these signals down by approximately one buffer delay and hence puts these input signals in a different speed bin than input signals I1 and I2. As the 4-input LUT architecture is expanded to add two more inputs, the two extra inputs may fall into a different speed bin than I4, I3, or I2, I1.

In order to operate 4-input LUT 100 as a small RAM (i.e., a LUTRAM), write decoder logic must be provided to individually write to each of the memory cells in programmable memory circuits M0–M15 during normal operation of 4-input LUT 100.

FIG. 2 is a circuit diagram of 4:16 write decoder logic 200 used in connection with 4-input LUT 100. Write decoder logic 200 includes inverters 201–218, transmission gates 230–233, transistors 240–243, capacitors 250–253, and NOR gates 260–275, which are connected as illustrated. Transistors 240–243 are used to set the node voltages to known values when the write decoder circuit is not in use. When the circuit is in use, a 4-bit write address is applied to select terminals I1–I4, identifying the programmable memory circuit to be written. A write enable signal (WE) is pulsed high, thereby transmitting the input signals I1–I4 through transmission gates 230–233, respectively. The WE signal then transitions to a low state, thereby storing the input signal values I1–I4 at the storage nodes coupled to ground GND through capacitors 250–253, respectively. These storage nodes provide a set of address signals to NOR gates 260–275. In response, NOR gates 260–275 provide write select signals Sel_0 to Sel_15, respectively, to the write access circuits associated with programmable memory circuits M0–M15, respectively. Only one of the write select signals Sel_0 to Sel_15 is activated to a logic high state at any given time, while the other fifteen write select signals are de-activated to logic low states.

It would be desirable to implement write decoder logic in a cost effective manner for a LUT having more than 4 inputs.

FIG. 3 is a circuit diagram illustrating memory circuit MC0 along with an associated write access circuit 301 used to implement a LUTRAM in 4-input LUT 100. N-channel CMOS pass transistors 311–314 are configured to selectively route a write data value to a programmable memory cell M0 in memory circuit MC0. The write data value provided on pins Din and Din# is written into memory cell M0 when both the write select signal Sel_0 (FIG. 2) and a write clock signal (Wclkram) are activated high. In this manner, the data value is written to programmable memory cell M0 in a synchronous manner with respect to the Wclkram signal. The q_0# signal provided by memory cell M0 is applied to inverter 340 through pass transistor 310. In response, inverter 340 provides a buffered Q0 output signal (which is logically equivalent to the q_0 signal).

Although only the write access circuit 301 associated with programmable memory circuit MC0 is illustrated, it is understood that each of the other memory circuits MC0–MC15 has a corresponding write access circuit. Each of these sixteen write access circuits is coupled to receive the same Din, Din# and Wclkram signals. In addition, each of the sixteen write access circuits is coupled to receive a corresponding one of the write select signals Sel_0 to Sel_15, such that the write data value is only written to one of the programmable memory circuits MC0–MC15.

It would be desirable to implement a LUTRAM function in a 6-input LUT in an efficient manner.

FIG. 3 also illustrates a shift register circuit 302 associated with programmable memory circuit MC0. Shift register circuit 302 includes n-channel pass transistors 320–322. A shifted data value Sin is loaded into memory cell M0 as follows. The shifted data value Sin is routed from an adjacent memory cell (e.g., a memory cell external to 4-input LUT 100). A shift clock signal (Wclksh) is applied to the gates of pass transistors 321–322. When the Wclksh signal has a logic high value, pass transistors 321–322 are turned on.

If the shifted data value Sin has a logic high state, transistor 320 is turned on, thereby pulling the voltage on the gate of pass transistor 310 down toward ground. As a result, transistor 310 turns off. However, the capacitance associated with pass transistor 310 causes the signal on the q_0# terminal to be applied to inverter 340 for a short period, such that the Q0 data signal is provided to an adjacent memory cell. The high state of the shifted data value Sin is also applied to the q_0 input terminal of memory cell M0. As a result, a logic high data value is written to programmable memory cell M0.

Conversely, if the shifted data value Sin has a logic low state, then transistor 320 is turned off, thereby leaving the gate of pass transistor 310 floating. Again, the capacitance associated with pass transistor 310 causes the signal on the q_0# terminal to be applied to inverter 340, such that the Q0 data signal is provided to an adjacent memory cell. The low state of the shifted data value Sin is also applied to the q_0 input terminal of memory cell M0. As a result, a logic low data value is written to programmable memory cell M0. Because shift register circuit 302 relies on the capacitance of pass transistor 310 to successfully shift data values, timing issues may arise with respect to this shift register circuit 302.

Because each of memory circuits M0–M15 requires an associated shift register circuit similar to shift register circuit 302, significant additional logic is added to 4-input LUT 100 in order to implement a 16-bit shift register. Expanding 4-input LUT 100 would require additional shift register circuits, which are costly in terms of layout area. It would therefore be desirable to have an expanded LUT that includes a shift register function, but which does not require excessive layout area for the associated shift control circuitry.

SUMMARY

Accordingly, the present invention provides an efficient 6-input LUT architecture. In accordance with one embodiment, the six-input look-up table architecture includes sixty-four memory cells, which store sixty-four corresponding data values. A set of sixty-four transmission gates is coupled to receive the sixty-four data values from the sixty-four memory cells. A first input line provides a first input signal to the set of sixty-four transmission gates, such that the set of sixty-four transmission gates routes thirty-two of the sixty-four data values in response to the first input signal. A set of thirty-two transmission gates is coupled to receive the thirty-two data values routed by the set of sixty-four transmission gates. A second input line provides a second input signal to the set of thirty-two transmission gates, such that the set of thirty-two transmission gates routes sixteen of the thirty-two data values in response to the second input signal. A 16:1 multiplexer is coupled to receive the sixteen data values routed by the set of thirty-two transmission gates. Third, fourth, fifth and sixth input lines provide third, fourth, fifth and sixth input signals, respectively, to the 16:1 multiplexer, such that the 16:1 multiplexer routes one of the sixteen data values in response to the third, fourth, fifth and sixth input signals.

A set of sixteen buffers can be coupled between the set of thirty-two transmission gates and the 16:1 multiplexer. In addition, the 16:1 multiplexer can include a first set of buffers configured to drive four data values within the 16:1 multiplexer, and a buffer configured to drive the output signal of the 16:1 multiplexer.

In an alternate embodiment, the six-input look-up table architecture can include a set of sixty-four transmission gates coupled to receive the sixty-four data values from the sixty-four memory cells. A 2:4 decoder is coupled to receive first and second input signals, and in response, provide four control signals to the set of sixty-four transmission gates. The set of sixty-four transmission gates is arranged to route sixteen of the sixty-four data values in response to the four control signals. A 16:1 multiplexer is coupled to receive the sixteen data values routed by the set of sixty-four transmission gates. Third, fourth, fifth and sixth input lines configured to provide third, fourth, fifth and sixth input signals, respectively, to the 16:1 multiplexer, such that the 16:1 multiplexer routes one of the sixteen data values in response to the third, fourth, fifth and sixth input signals.

In accordance with another embodiment, a six-input look-up table architecture includes sixty-four memory cells adapted to store sixty-four corresponding data values. A 64:1 multiplexer includes input terminals coupled to receive the sixty-four data values from the sixty-four memory cells. Six input signals are provided to corresponding control terminals of the 64:1 multiplexer, wherein the 64:1 multiplexer is configured to asynchronously read any one of the sixty-four data values as an output value in response to the six input signals. Sixty-four write control circuits are coupled to the sixty-four memory cells. A first write address decoder is coupled to receive a first subset of the six input signals, and in response, provide a first set of write select signals to the sixty-four write control circuits. A second write address decoder is coupled to receive a second subset of the six input signals and a write clock signal, and in response, provide a plurality of decoded write clock signals to the sixty-four write control circuits. Applying these decoded signals from the two write address decoders in a certain pattern to the sixty-four write control circuits ensures that only one of the write control circuits provides the data on the data line, by providing access to the corresponding memory cell. These decoded signals also ensure that the write operation is performed synchronously with respect to the write clock signal.

In a particular embodiment, the first write address decoder is a 4:16 decoder that provides a set of sixteen write select signals in response to four of the input signals. These sixteen write select signals are provided to four groups of sixteen write control circuits. In an alternate embodiment, the first write address decoder includes two 2:4 decoders configured to provide the first set of write select signals in response to four of the input signals, along with a modified version of the write control circuit.

The second write address decoder can be a 2:4 decoder coupled to receive two of the input signals, and in response, provide four select signals. These four select signals are coupled with the clock signal to generate four decoded write clock signals, wherein only one of the four decoded write clock signals is enabled at a time. One of the sixty-four write control circuits routes the write data value to a corresponding memory circuit in response to a combination of inputs from the first set of write select signals and the decoded write clock signals.

In one embodiment, each write control circuit includes a first set of pass transistors, each having a control terminal (e.g., gate) coupled to receive a write select signal from the first set of write select signals. Each write control circuit also includes a second set of pass transistors, each having a control terminal coupled to receive one of the decoded write clock signals. The first and second sets of pass transistors are configured to route the write data value to the corresponding memory cell when the received write select signal and decoded write clock signal are activated.

In accordance with yet another embodiment of the present invention, a six-input look-up table architecture includes sixty-four memory cells, and a 64:1 multiplexer having input terminals coupled to the sixty-four memory cells, wherein the sixty-four memory cells are used to implement thirty-two shift register cells.

Each of the thirty-two shift register cells includes a first shift control circuit coupled to receive a shift input data value and a shift clock signal. The first shift control circuit is adapted to pass a data signal representative of the shift input data value in response to the shift clock signal. More specifically, the first shift control circuit passes the shift input data value during a first half cycle of the shift clock signal. A first memory cell stores the data signal passed by the first shift control circuit. This first memory cell operates as a master latch, which stores the data signal for subsequent transfer to a second memory cell. A second shift control circuit is coupled to receive the data signal stored by the first memory cell and the inverse of the shift clock signal. The second shift control circuit passes the data signal stored by the first memory cell in response to the inverse of the shift clock signal. More specifically, the second shift control circuit passes the data signal during a second half cycle of the shift clock signal. A second memory cell stores the data signal passed by the second shift control circuit. This second memory cell operates as a slave latch, which stores the data signal transferred from the first memory cell. In one embodiment, each of the shift control circuits includes only three CMOS pass transistors. As a result, the layout area of the shift register logic is minimized.

The present invention will be more fully understood in view of the following description and drawings.

DETAILED DESCRIPTION

In accordance with one embodiment of the present invention, a 6-input LUT is implemented with a 64:1 multiplexer having 6 select lines. The select lines of this multiplexer are referred to as the 'inputs' of the 6-input LUT. The 64 data inputs of the multiplexer are provided by programmable SRAM memory cells (or modified versions of the same). Additional circuitry enables the 6-input LUT to be programmed to work as a small RAM or as a shift register. The 64 programmable memory cells of the LUT can be programmed to generate any function of the 6 input signals when the LUT is used as a function generator.

Figure 1:
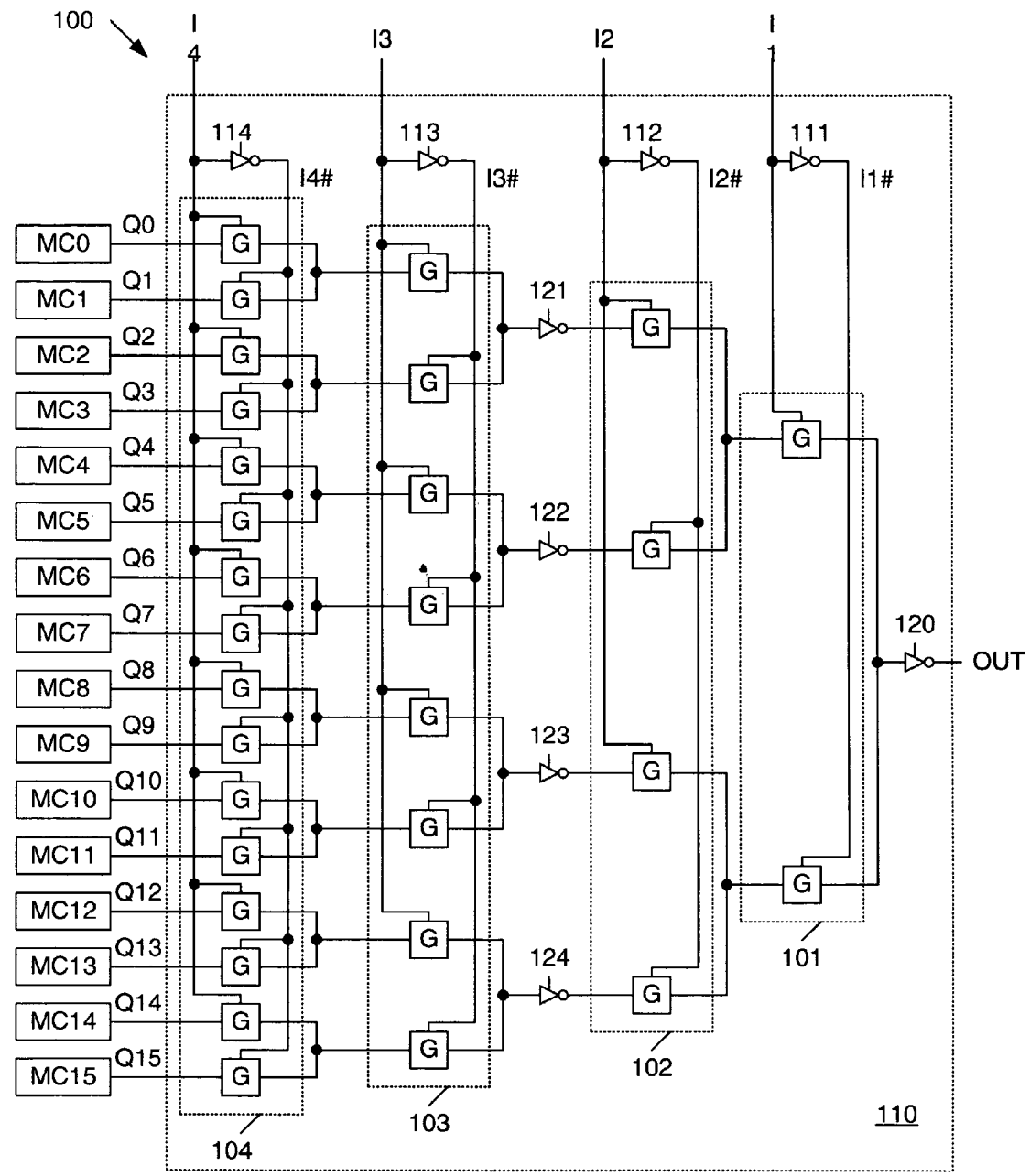
FIG. 1 is a circuit diagram of a conventional 4-input LUT architecture.
Figure 2:
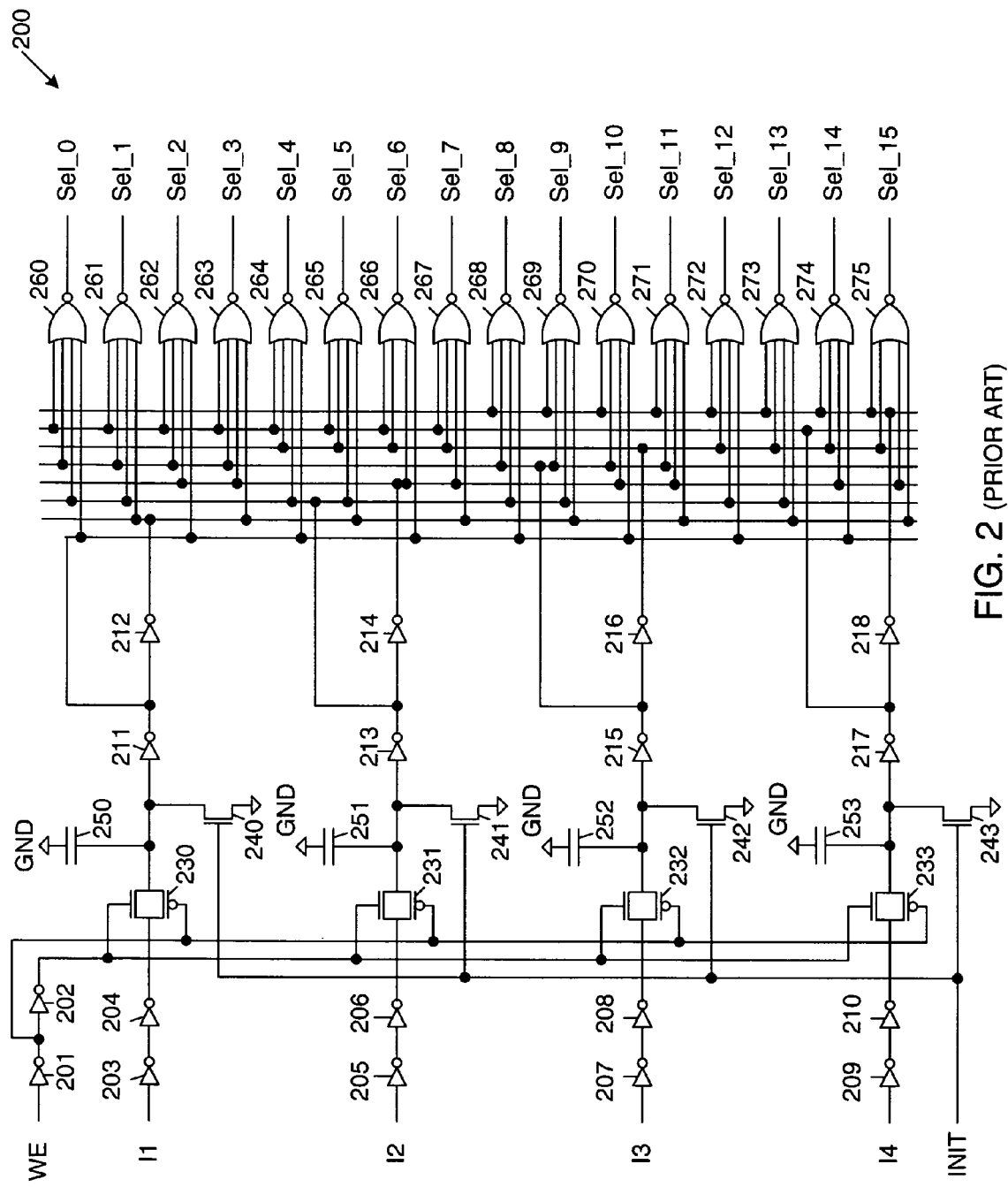
FIG. 2 is a circuit diagram of a 4:16 write decoder used in connection with the 4-input LUT architecture of FIG. 1.
Figure 3:
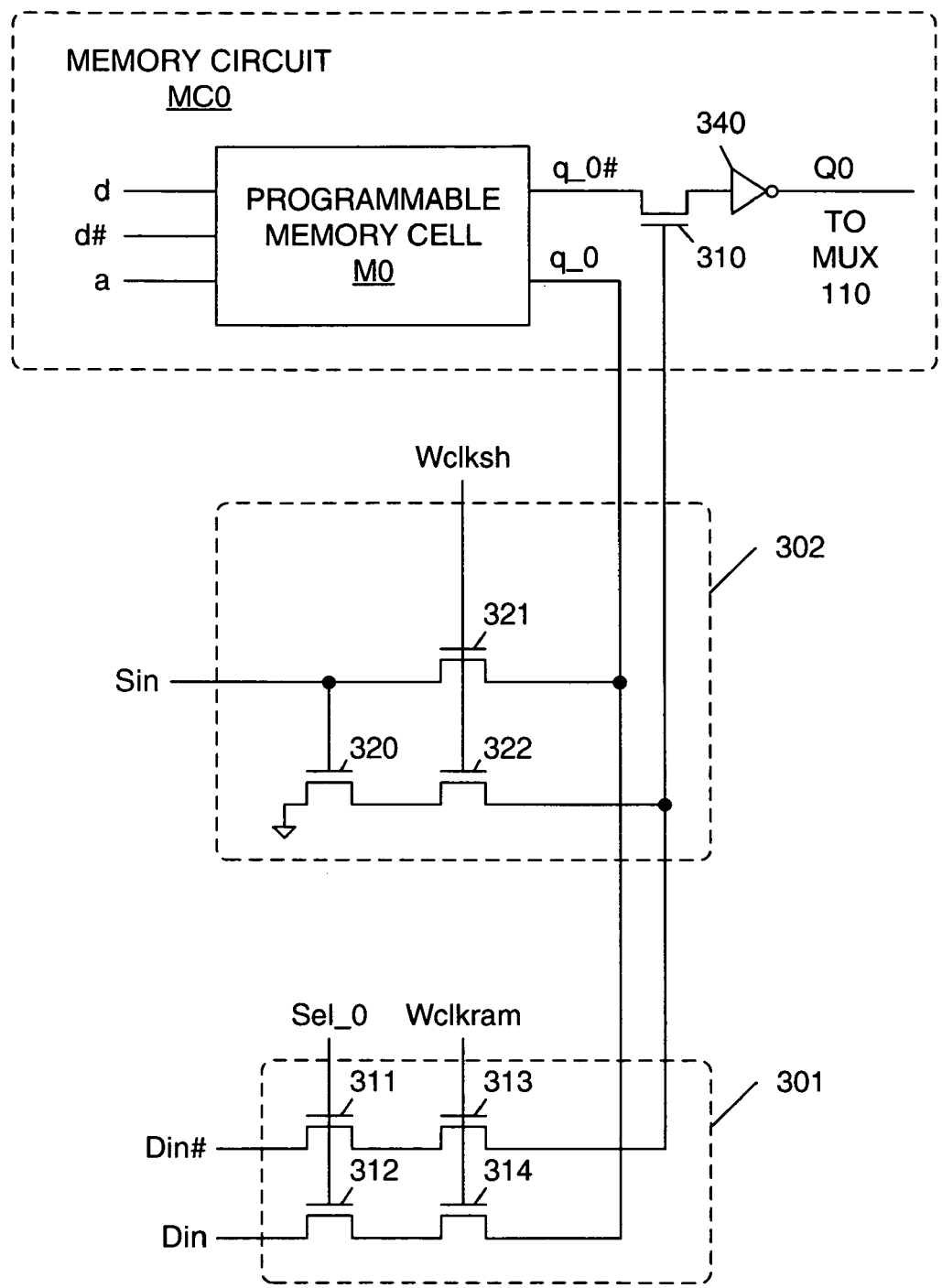
FIG. 3 is a circuit diagram illustrating a memory circuit of the 4-input LUT of FIG. 1, along with an associated write access circuit and an associated shift control circuit.

The implementation of the 64:1 multiplexer and the associated circuitry that enables the LUT to operate as a small RAM or a shift register are the subjects of the present invention. In the present disclosure, the differences between the 4-input LUT architecture (FIGS. 1–3) and the 6-input LUT architectures (FIGS. 4–14) are explained in order to highlight the advantages of the 6-input LUT architecture.

Figure 4:
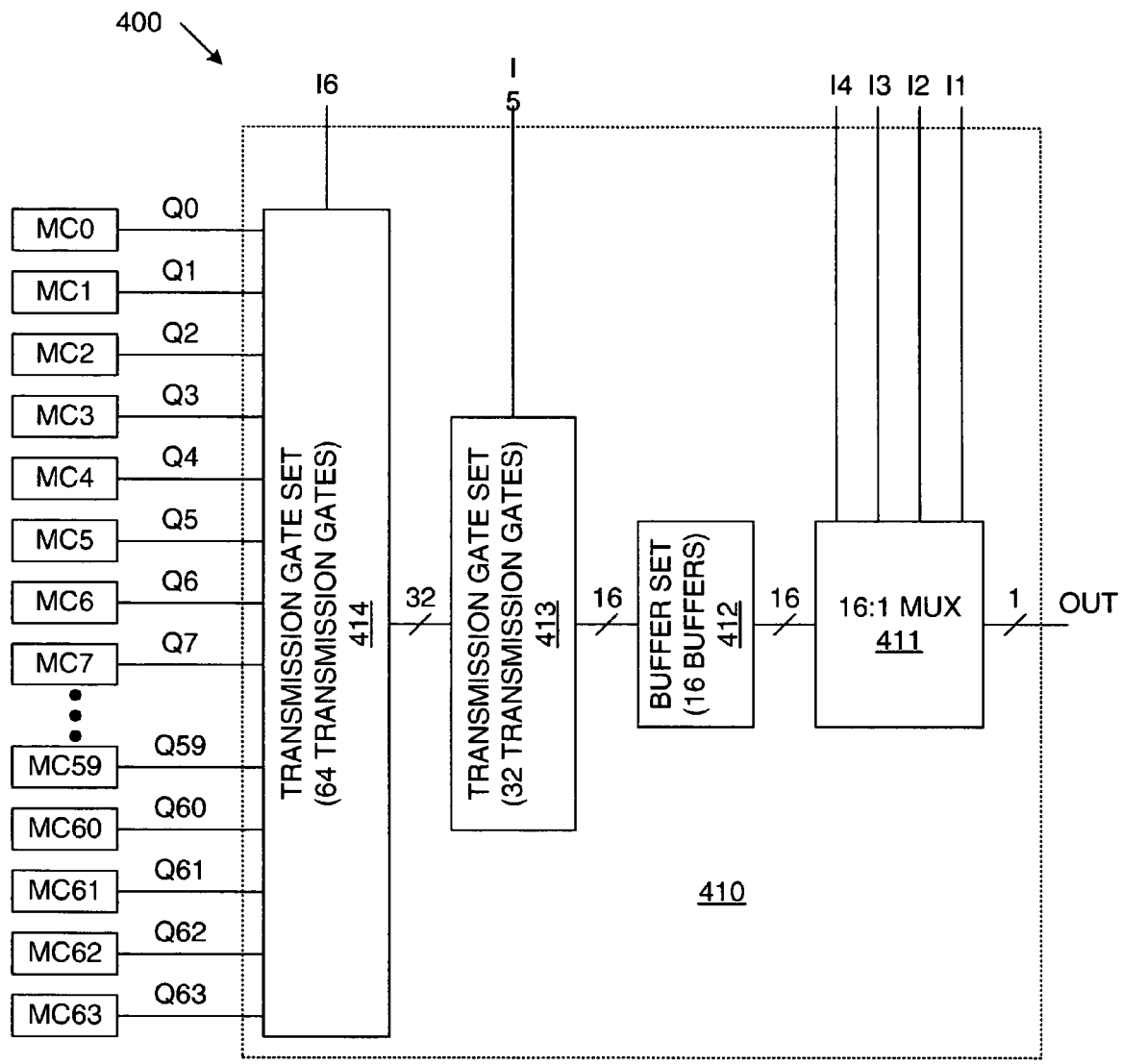
FIG. 4 is a block diagram of a 6-input LUT in accordance with one embodiment of the present invention.

FIG. 4 is a block diagram of a 6-input LUT 400 in accordance with one embodiment of the present invention. 6-input LUT 400 includes 64:1 multiplexer 410 and memory circuits MC0–MC63. Memory circuits MC0–MC63 provide corresponding data values Q0–Q63 to input terminals of multiplexer 410. Input signals I1–I6 are provided to control terminals of multiplexer 410. In the present embodiment, 64:1 multiplexer 410 includes a 64:16 multiplexer, which is made up of CMOS transmission gate sets 413 and 414, a buffer set 412 and a 16:1 multiplexer 411 (which may be identical to the 16:1 multiplexer 110 of FIG. 1). Each of the 64 transmission gates in transmission gate set 414 is coupled to receive a data value Q0–Q63 from a corresponding one of the 64 programmable memory circuits MC0–MC63. Multiplexer 410 routes one of the data values Q0–Q63 as an output signal (OUT) in response to the six input signals I1–I6.

More specifically, transmission gate set 414 routes 32 of the 64 data values received from memory circuits M0–M63 in response to the input signal I6. Transmission gate set 413 routes 16 of the 32 data values received from transmission gate set 414 in response to the input signal I5. A buffer set 412, which includes sixteen non-inverting buffers, is coupled to receive the 16 data values routed by transmission gate set 413. Multiplexer 411 then routes one of the 16 data values received from buffer set 412 in response to the input signals I1–I4.

Figure 5:
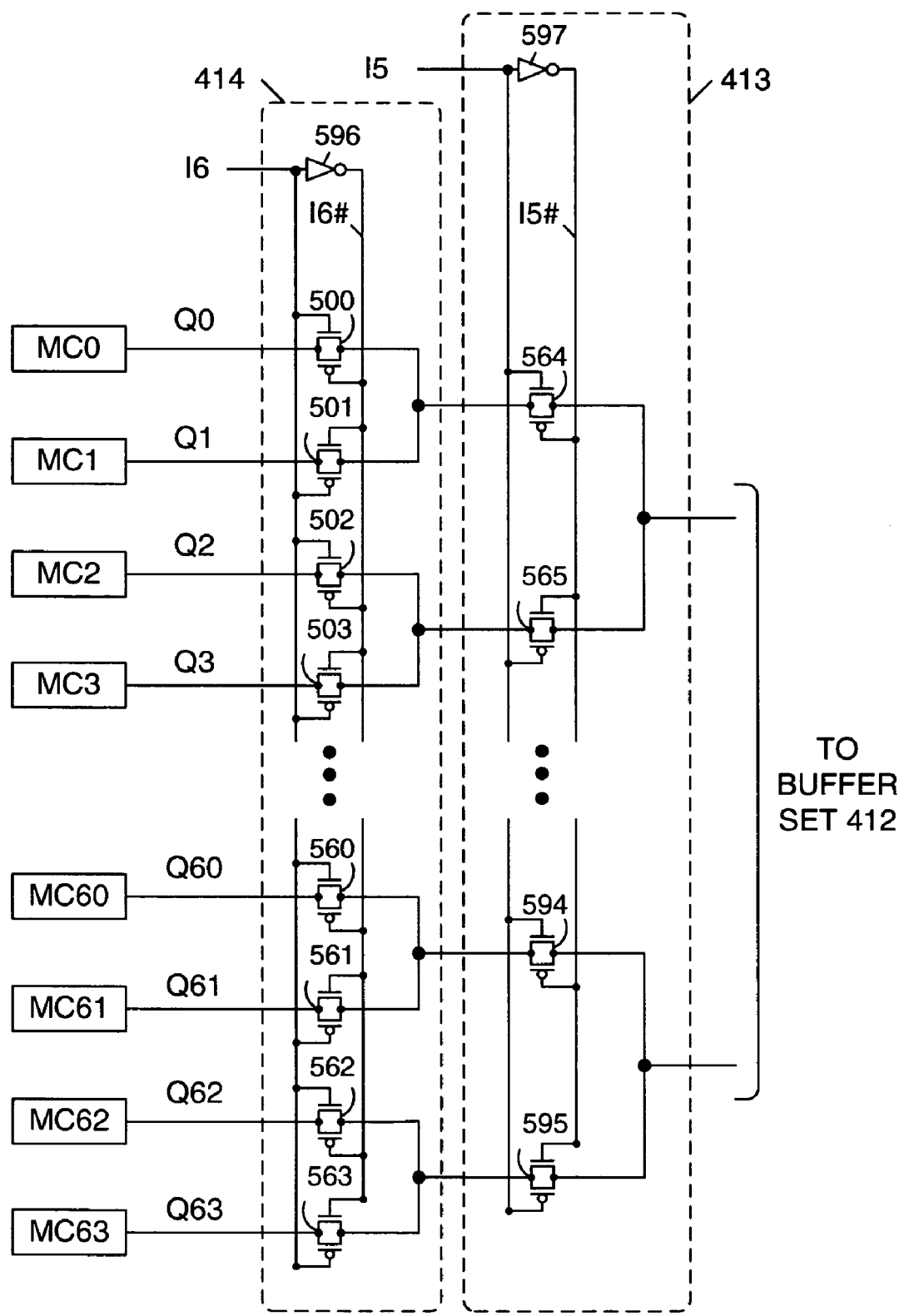
FIG. 5 is a circuit diagram that illustrates a pair of transmission gate sets of the 6-input LUT of FIG. 4, in accordance with one embodiment of the present invention.

FIG. 5 is a circuit diagram that illustrates transmission gate set 414 and transmission gate set 413, in accordance with one embodiment of the present invention. Transmission gate set 414 includes 64 CMOS transmission gates 500–563, which are coupled to receive data values Q0–Q63, respectively. Input signal I6 and the complement of this input signal (I6#) (as provided by inverter 596) control transmission gates 500–563. When the input signal I6 has a logic high state, the even-numbered transmission gates in transmission gate set 414 pass the corresponding data values to transmission gate set 413. Conversely, when the input signal I6 has a logic low state, the odd-numbered transmission gates in transmission gate set 414 pass the corresponding data values to transmission gate set 413.

Transmission gate set 413 includes 32 CMOS transmission gates 564–595, which are coupled to receive the 32 data values passed by transmission gate set 414. Input signal I5 and the complement of this input signal (I5#) (as provided by inverter 597) control transmission gates 564–595. When the input signal I5 has a logic high state, the even-numbered transmission gates in transmission gate set 414 pass the corresponding data values to buffer set 412. Conversely, when the input signal I5 has a logic low state, the odd-numbered transmission gates in transmission gate set 413 pass the corresponding data values to buffer set 412.

Figure 6:
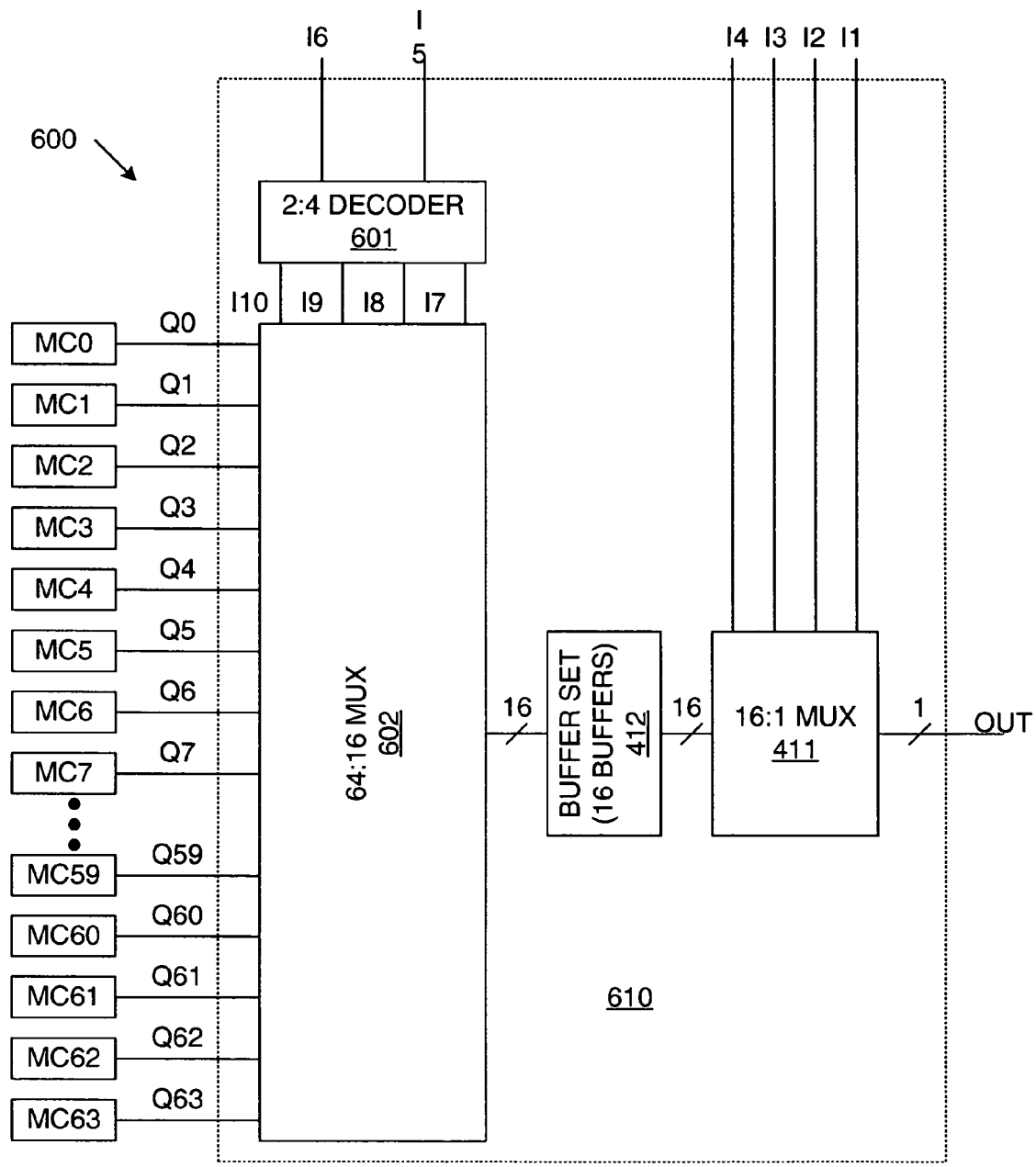
FIG. 6 is a block diagram of a 6-input LUT in accordance with another embodiment of the present invention.
Figure 7:
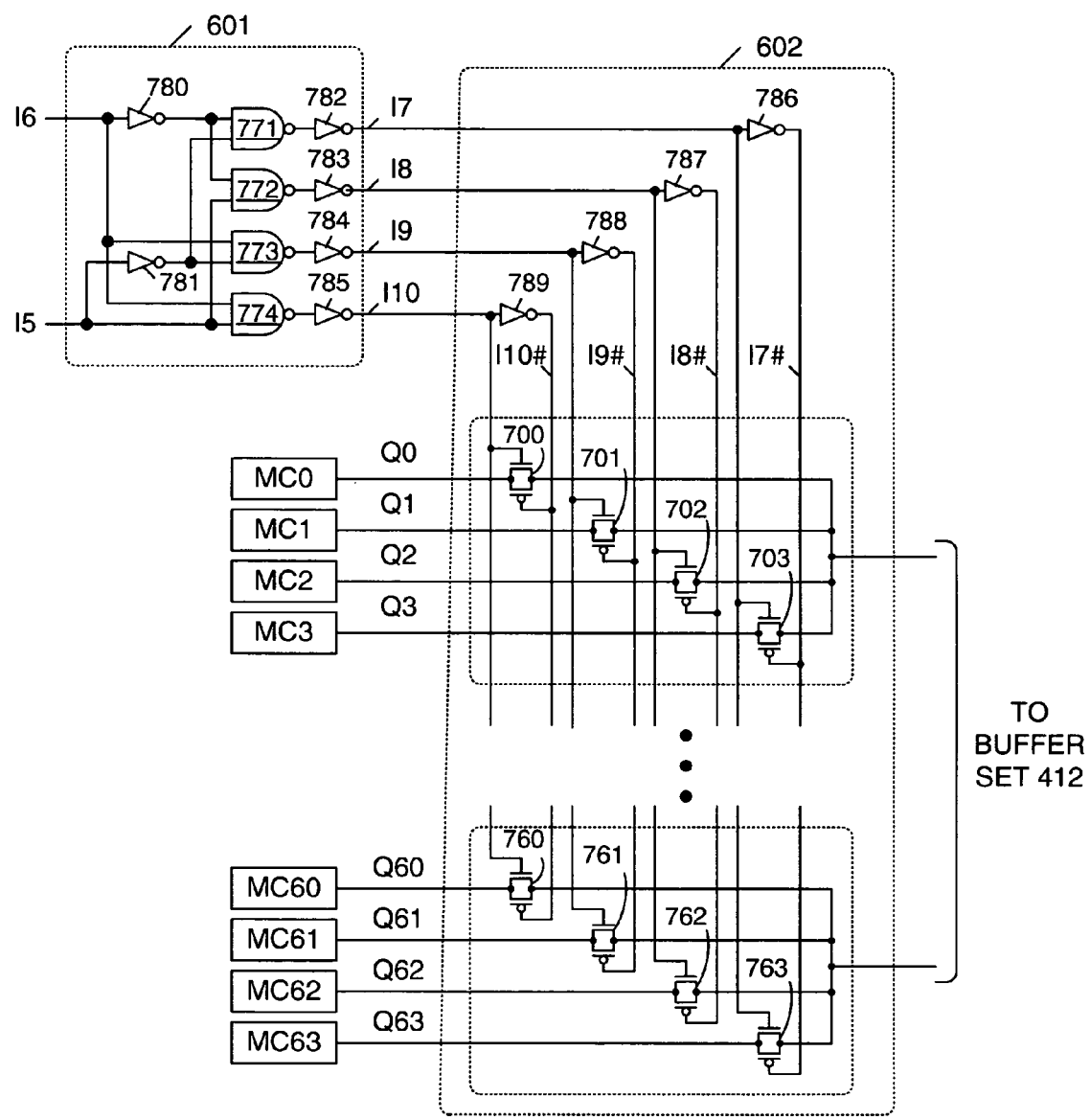
FIG. 7 is a circuit diagram of a 2:4 decoder and a 64:16 multiplexer used in the 6-input LUT of FIG. 6, in accordance with one embodiment of the present invention.

FIG. 6 is a block diagram of a 6-input LUT 600 with a 64:1 multiplexer 610 in accordance with another embodiment of the present invention. Similar elements in FIGS. 4 and 6 are labeled with similar reference numbers. Multiplexer 610 replaces the transmission gate sets 413 and 414 of multiplexer 410 with a 2:4 decoder circuit 601 and a 64:16 multiplexer 602. In this embodiment, the input signals I5 and I6 are decoded by 2:4 decoder circuit 601, thereby producing four input signals I7–I10. These four input signals I7–I10 are used to control 64:16 multiplexer 602. Multiplexer 602 passes sixteen of the 64 data values Q0–Q63 provided by memory circuits MC0–MC63 in the manner described below (FIG. 7). The sixteen data values passed by multiplexer 602 are provided to buffer set 412 and 16:1 multiplexer 411 in the manner described above (FIG. 4).

FIG. 7 is a circuit diagram of 2:4 decoder 601 and multiplexer 602, in accordance with one embodiment of the present invention. Multiplexer 602 includes transmission gates 700–763, which are coupled to receive data values Q0–Q63, respectively, and inverters 786–789, which provide complementary input signals I7#–I10#, respectively. Note that multiplexer 602 only requires 64 transmission gates 700–763. Thus, multiplexer 610 uses 32 fewer transmission gates than multiplexer 410 (FIG. 4). Decoder circuit 601 includes four NAND gates 771–774, and six inverters 780–785, which are connected as illustrated. Because the decoded signals I7–I10 drive large loads, the logic gates used to implement 2:4 decoder 701 have to be large enough to ensure sufficiently small delays. As a result, the area occupied by 2:4 decoder 601 may be larger than the combined layout area of the 32 transmission gates that are saved. Conversely, while the 2:4 decoder 601 introduces delay, the required number of transmission gates is reduced, which offsets some of the delay introduced by the decoder 601. In addition, the input signal buffering provided by NAND gates 771–774 further offsets some of the delay introduced by the decoder 601.

In accordance with one embodiment, one (and only one) of the decoded signals I7–I10 is activated high in response to the input signals I5–I6. The logic high decoded signal activates one of every four transmission gates. For example, a logic high decoded signal I9 activates transmission gates 701, 705, 709, 713, 717, 721, 725, 729, 733, 737, 741, 745, 749, 753, 757 and 761, thereby providing 16 data values to buffer set 412.

In accordance with another embodiment, the multiplexer structure of FIG. 7 can be modified to create a 64:1 multiplexer that includes a 64:4 multiplexer coupled to a 4:1 multiplexer. In this embodiment, the 64:4 multiplexer passes four of the 64 data values Q0–Q63 in response to sixteen control signals provided by a 4:16 decoder. This 4:16 decoder provides the sixteen control signals in response to the input signals I3, I4, I5 and I6. The 4:1 multiplexer (which can be identical to transmission gate sets 101 and 102 of FIG. 1) passes one of the four data signals passed by the 64:4 multiplexer in response to the input signals I1 and I2.

Among these three proposed architectures, the various locations and sizes of the buffers, CMOS transmission gates and other logic will provide various results for each architecture, in terms of the speed of the various inputs and the area the circuit occupies on silicon. In some fabrication processes, the first architecture described in FIGS. 4–5 above might have a speed advantage and has about the same area cost when compared with the other two architectures. However, other results may exist in other processes.

Figure 8:
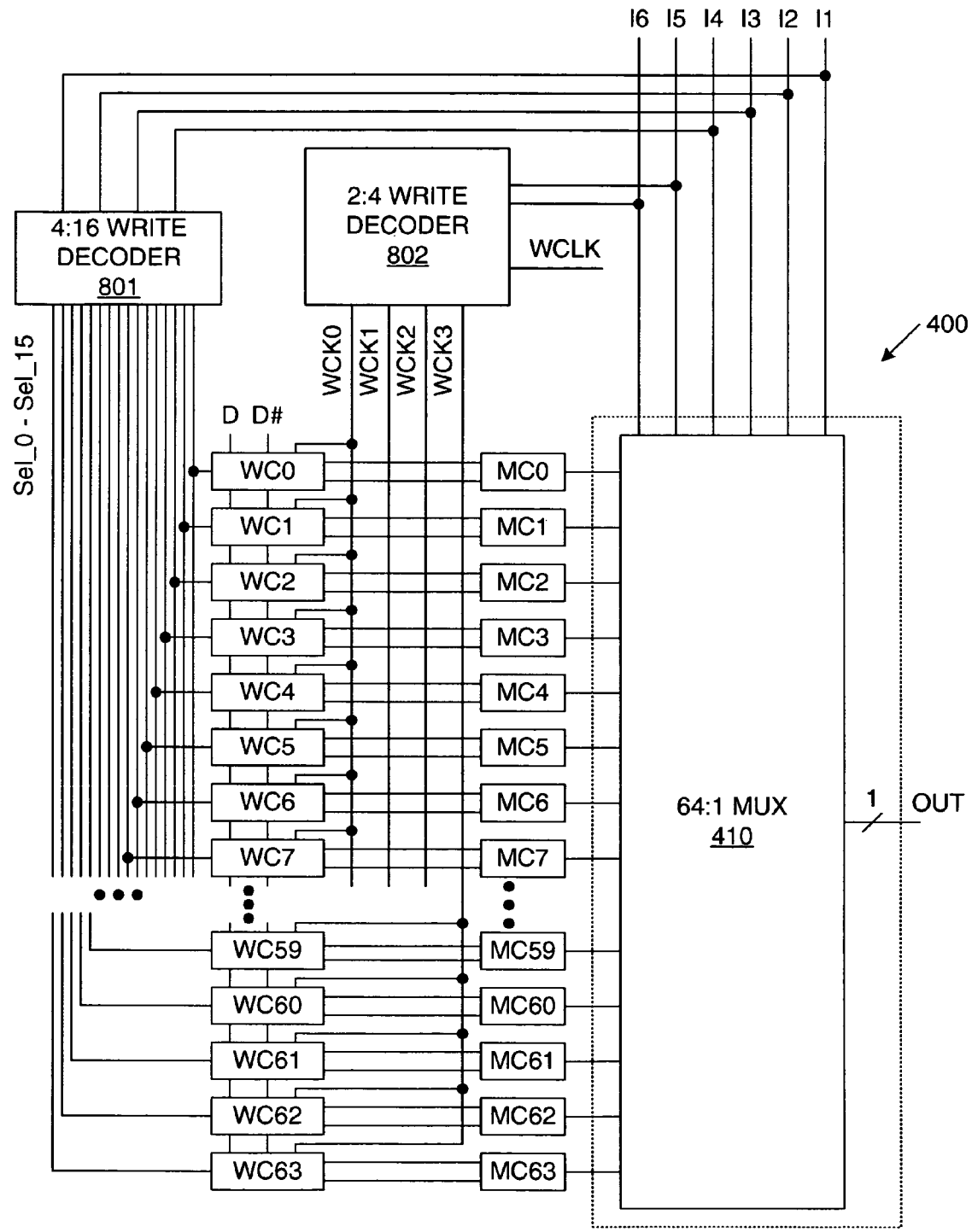
FIG. 8 is a block diagram of the 6-input LUT of FIG. 4, along with an associated 4:16 write decoder, 2:4 write decoder, and write control circuits, in accordance with one embodiment of the present invention.

As shown in FIG. 8, the 6-input LUT 400 can be used to implement a small RAM (64-bits) with synchronous write and asynchronous read capabilities. Such a RAM is hereinafter referred to as a LUTRAM.

Data and address lines must be provided to read the data values Q0–Q63 from the LUTRAM and to write the data values Q0–Q63 to the LUTRAM. The asynchronous read capability is achieved using the 64:1 multiplexer 410 (i.e., the read tree) in the 6-input LUT 400. The input select lines I1–I6 of multiplexer 410 act as the address lines for the read tree, and the read data is provided at the output (OUT) of multiplexer 410. Because the 64:1 multiplexer 410 is being used as the read tree for the LUTRAM, there is no additional circuitry required to implement an asynchronous read operation using the 6-input LUT 400.

To achieve the synchronous write capability for the LUTRAM, a write data line and write address lines have to be provided. The write address lines select the memory circuit that will receive the data value provided on the write data line. In order to provide the write address to the memory cells, the input signals I1–I6 of the 6-input LUT 400 are used. Write decode logic is necessary to decode the LUT inputs I1–I6. For the 6-input LUT, a 6:64 decode function is required to activate the addressed memory circuit in response to the input signals I1–I6. The obvious solution would be to provide sixty-four 6-input NOR gates to perform this decoding function. However, this solution is expensive in terms of layout area.

FIG. 8 is a block diagram of 6-input LUT 400, along with an associated 4:16 write address decoder 801, 2:4 write address decoder 802 and write control circuits WC0–WC63, in accordance with one embodiment of the present invention. 64:1 multiplexer 610 (FIG. 6) can be substituted for 64:1 multiplexer 410 in other embodiments. Write decoder 801 is coupled to receive the 4 input signals I1–I4. Write decoder 801 provides 16 write select signals Sel_0–Sel_15 in response to the input signals I1–I4. More specifically, write decoder 801 activates one of the 16 write select signals high and deactivates the remaining 15 write select signals low in response to the input signals I1–I4. Each write select signal Sel_N is applied to write control circuits WC(N), WC(N+16), WC(N+32) and WC(N+48), respectively, wherein N is an integer between 0 and 15. In accordance with one embodiment, write decoder 801 is identical to the 4:16 decoder 200 illustrated in FIG. 2. The 16 outputs of the 4:16 decoder 801 ensure that in any 16 consecutive memory cells, only one memory cell is selected. Thus, at any time, only 4 of the 64 memory circuits MC0–MC63 will have their associated write select signals activated.

Figure 9:
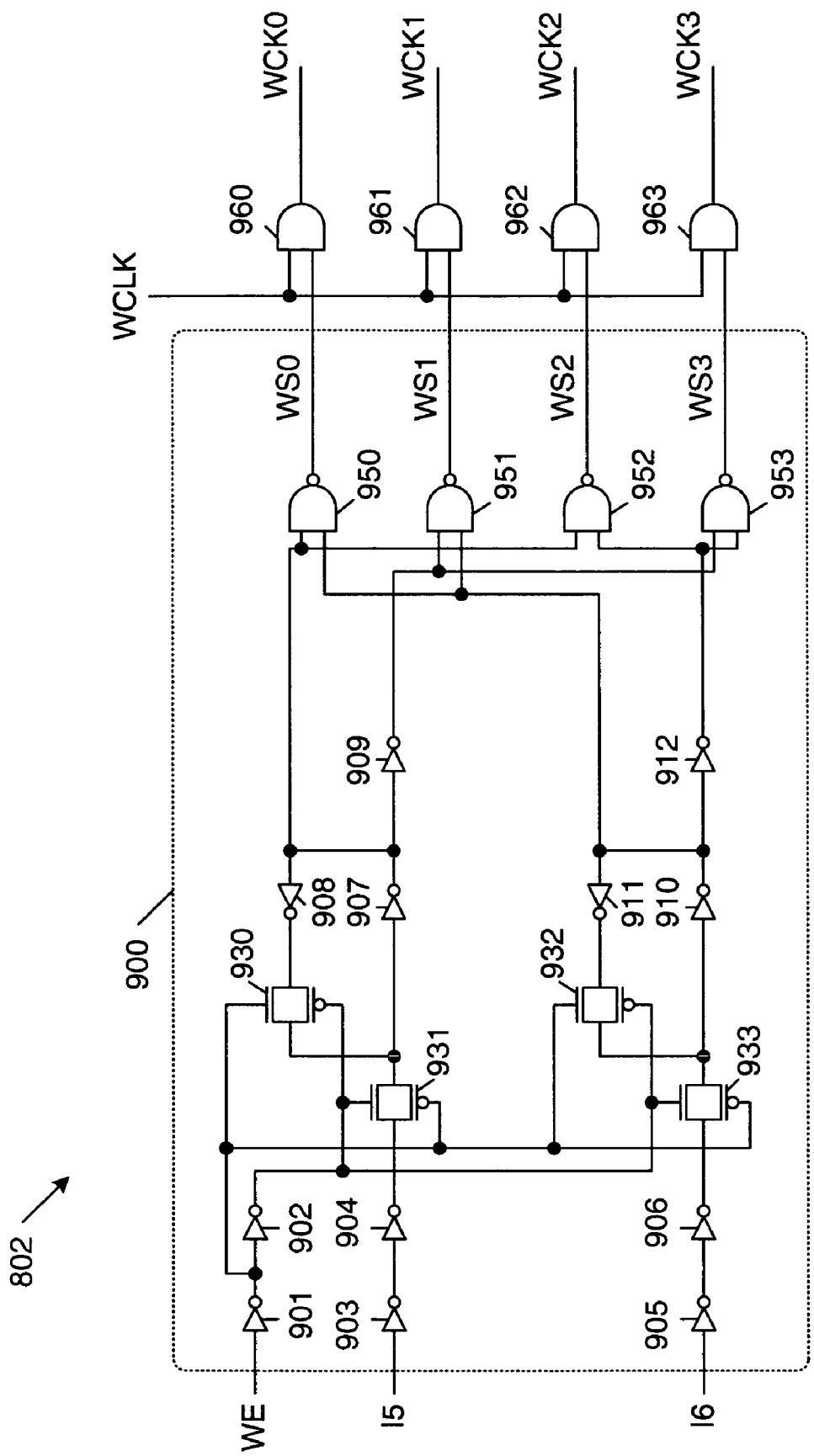
FIG. 9 is a circuit diagram of the 2:4 write decoder of FIG. 8 in accordance with one embodiment of the present invention.

FIG. 9 is a circuit diagram of write address decoder 802 in accordance with one embodiment of the present invention. Write address decoder 802 includes 2:4 decoder 900 and AND gates 960–963. 2:4 decoder 900 includes inverters 901–912, transmission gates 930–933 and NAND gates 950–953, which are connected as illustrated.

When the write enable signal (WE) is high, transmission gates 931–932 are turned on, thereby transmitting the input signals I5–I6 to the cross-coupled inverter pairs 907–908 and 910–911, respectively. These cross-coupled inverter pairs provide a first set of address signals to NAND gates 950–953 as illustrated. In response, these NAND gates 950–953 provide a second set of address signals WS0–WS3, respectively, to AND gates 960–963. 2:4 decoder 900 activates one of the four write select signals WS0–WS3 high and deactivates the remaining three write select signals low in response to the first set of address signals.

Write select signals WS0–WS3 are applied to input terminals of AND gates 960–963, respectively. A write clock signal WCLK is applied to the other input terminals of AND gates 960–963. In response, AND gates 960–963 provide write clock signals WCK0–WCK3, respectively. Write clock signal WCK0 is provided to write control circuits WC0–WC15. Write clock signal WCK1 is provided to write control circuits WC16–WC31. Write clock signal WCK2 is provided to write control circuits WC32–WC47. Write clock signal WCK3 is provided to write control circuits WC48–WC63. Write select signals WS0–WS3 only activate one of the write clock signals WCK0–WCK3 at any given time. As described in more detail below, the activated one of the write clock signals WCK0–WCK3, in combination with the activated one of the write select signals Sel_0–Sel_15, will activate a corresponding one of the write control circuits WC0–WC63.

The additional resource cost required to provide the synchronous write function to 6-input LUT 400, when compared with 4-input LUT 100, is a 2:4 decoder 900 and 2-input AND gates 960–963. Advantageously, this additional resource cost is relatively small.

A write data signal (D) and the complement of this write data signal (D#) are applied to each of the write control circuits WC0–WC63 (see FIG. 8). As described in more detail below, the write data value is written into one of the memory circuits MC0–MC63 in response to the Sel_0–Sel_15 write select signals and the write clock signals WCK0–WCK3.

Figure 10:
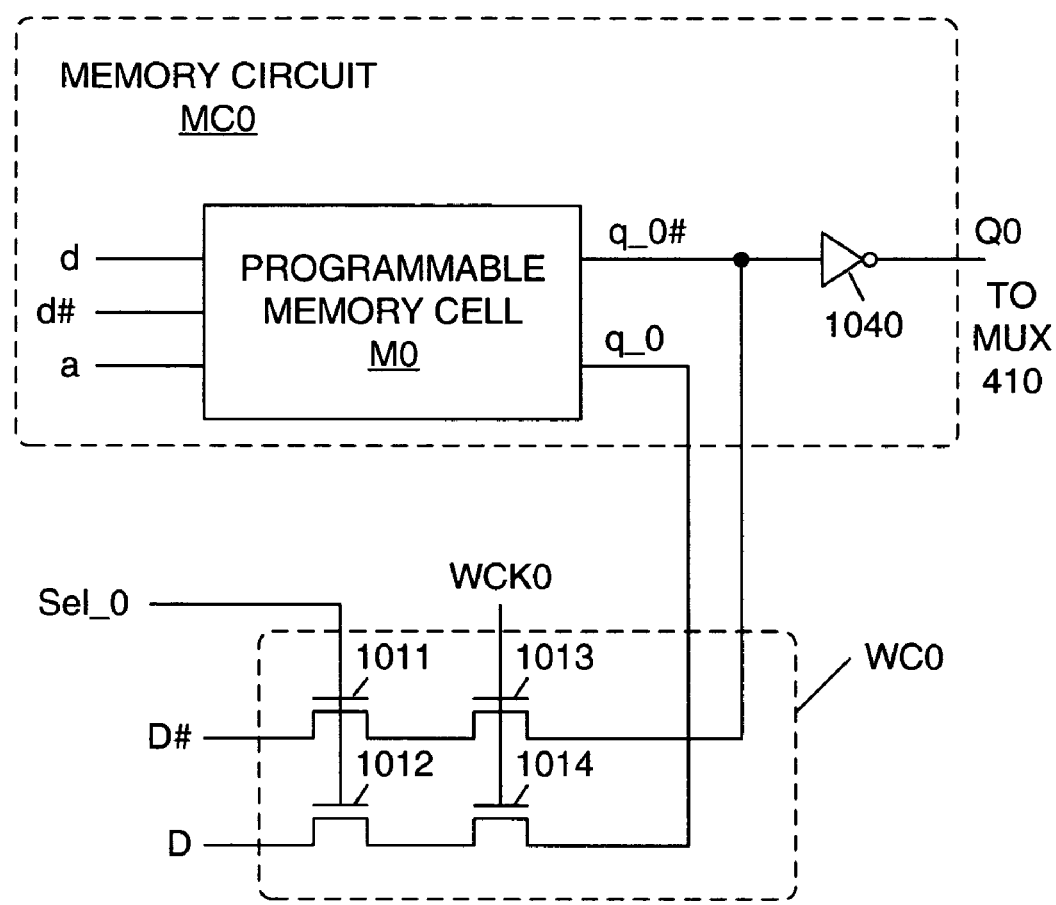
FIG. 10 is a circuit diagram illustrating a write control circuit and a corresponding memory circuit in accordance with one embodiment of the present invention.

FIG. 10 is a circuit diagram illustrating write control circuit WC0 and memory circuit MC0 in accordance with one embodiment of the present invention. Write control circuit WC0 includes n-channel pass transistors 1011–1014. The gates of pass transistors 1011 and 1012 are coupled to receive the write select signal Sel_0 from write decoder 801. First source/drain regions of pass transistors 1011 and 1012 are coupled to receive the D# and D write data signals, respectively. If the write select signal Sel_0 is activated high, transistors 1011 and 1012 are turned on, thereby enabling the data value represented by write data signals D# and D to be routed to first source/drain regions of pass transistors 1013 and 1014.

The gates of pass transistors 1013 and 1014 are coupled to receive the write clock signal WCK0. When the write clock signal WCK0 is activated high (by a logic high write select signal WS0) the write clock signal WCK0 will transition between logic high and low states in response to the write clock signal WCLK. When the write clock signal WCK0 transitions to a logic high state, pass transistors 1013 and 1014 are turned on, thereby providing the data value represented by write data signals D# and D to the q__0# and q__0 terminals of memory cell M0. As a result, the write data value is written to memory cell M0 in a synchronous manner with respect to the write clock signal WCLK. Note that inverter 1040 routes the data value stored in memory cell M0 to multiplexer 410 as the output value Q0.

In another possible area-cost-effective implementation, each of write control circuits WC0–WC63 includes three sets of series-connected CMOS pass transistors, and the 4:16 decoder 801 is split into two separate 2:4 decoders. This implementation is described in more detail below.

Figure 11:
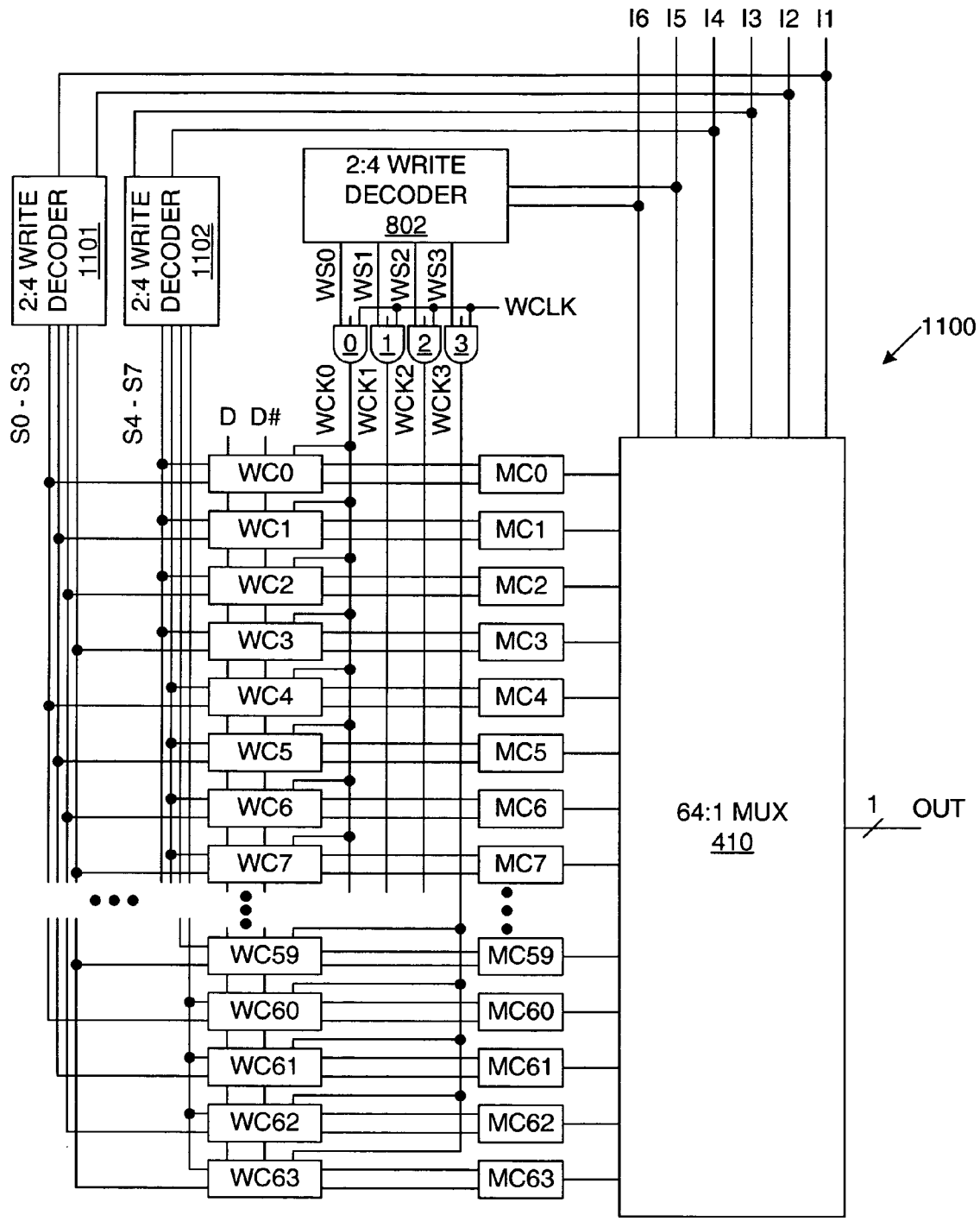
FIG. 11 is a block diagram of the 6-input LUT of FIG. 4, along with a pair of 2:4 write decoders, which replace the 4:16 write decoder of FIG. 8.

FIG. 11 is a block diagram of a 6-input LUT that includes a pair of 2:4 write decoders 1101–1102, which replace the 4:16 write decoder 801 of FIG. 8. Write decoders 1101–1102 can have the same construction as 2:4 write decoder 900 (FIG. 9). Similar elements in FIGS. 8 and 11 are labeled with similar reference numbers. Write decoder 1101 provides write select signals S0–S3 in response to the input signals I1–I2 and write decoder 1102 provides write select signals S4–S7 in response to the input signals I3–I4.

Figure 12:
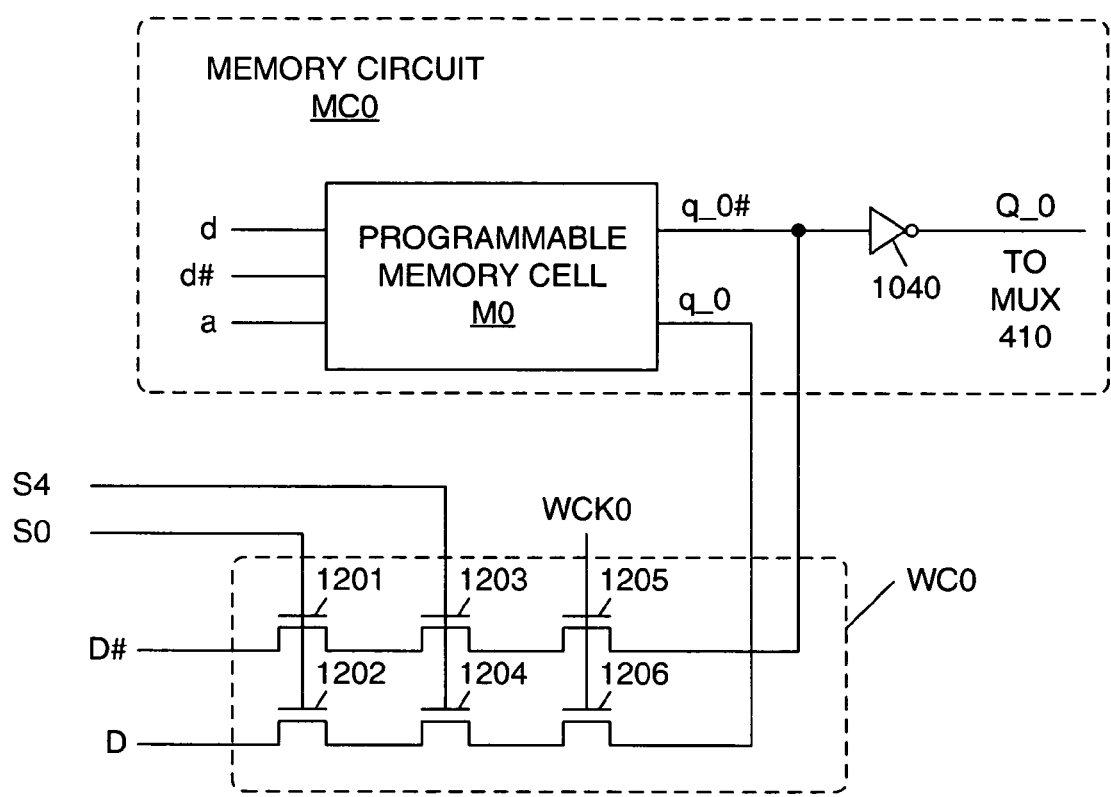
FIG. 12 is a circuit diagram illustrating a write control circuit and a corresponding memory circuit in accordance with the embodiment of the present invention illustrated by FIG. 11.

FIG. 12 is a circuit diagram of write control circuit WC0 in accordance with one embodiment of the present invention. Write control circuits WC1–WC63 are similar to write control circuit WC0. Write control circuit WC0 includes n-channel pass transistor sets 1201–1202, 1203–1204 and 1205–1206. The gates of pass transistors 1201–1202 are coupled to receive the select signal S0, the gates of pass transistors 1203–1204 are coupled to receive the select signal S4, and the gates of pass transistors 1205–1206 are coupled to receive the write clock signal WCK0. When the signals S1, S4 and WCK0 are all activated high, the data value identified by data signals D and D# is provided to memory cell M0. The remaining write control circuits WC1–WC63 are configured to receive the write select signals S0–S3 and S4–S7 and the write clock signals WCLK0–WCLK3 in the manner defined by Table 1. Note that only one of the write select signals S0–S3, one of the write select signals S4–S7 and one of the write clock signals WCLK0–WCLK3 is activated high at any given time. As a result, the write data value identified by data signals D and D# is only written to one of the sixty-four memory circuits MC0–MC63. This embodiment reduces the area required for the write decode logic (1101–1102) at the expense of two additional pass gates in each of the write control circuits WC0–WC63.

Other decoder combinations are possible in other embodiments.

In accordance with another embodiment of the present invention, shift register circuitry is added to the 6-input LUT 400, thereby enabling this LUT to operate as a 32-bit shift register. The shift register circuitry, which is coupled to each of the memory circuits MC0–MC63, causes each of the even-numbered memory cells to operate as a master latch, and causes each of the odd-numbered memory cells to operate as a slave latch. As described in more detail below, implementing a 32-bit shift register, rather than a 64-bit shift register, saves a significant amount of repeated logic, thereby saving significant layout area.

TABLE 1

| WC0 | S0 | S4 | WCK0 |
| WC1 | S1 | S4 | WCK0 |
| WC2 | S2 | S4 | WCK0 |
| WC3 | S3 | S4 | WCK0 |
| WC4 | S0 | S5 | WCK0 |
| WC5 | S1 | S5 | WCK0 |
| WC6 | S2 | S5 | WCK0 |
| WC7 | S3 | S5 | WCK0 |
| WC8 | S0 | S6 | WCK0 |

TABLE 1-continued

| WC9  | S1 | S6 | WCK0 |
| WC10 | S2 | S6 | WCK0 |
| WC11 | S3 | S6 | WCK0 |
| WC12 | S0 | S7 | WCK0 |
| WC13 | S1 | S7 | WCK0 |
| WC14 | S2 | S7 | WCK0 |
| WC15 | S3 | S7 | WCK0 |
| WC16 | S0 | S4 | WCK1 |
| WC17 | S1 | S4 | WCK1 |
| WC18 | S2 | S4 | WCK1 |
| WC19 | S3 | S4 | WCK1 |
| WC20 | S0 | S5 | WCK1 |
| WC21 | S1 | S5 | WCK1 |
| WC22 | S2 | S5 | WCK1 |
| WC23 | S3 | S5 | WCK1 |
| WC24 | S0 | S6 | WCK1 |
| WC25 | S1 | S6 | WCK1 |
| WC26 | S2 | S6 | WCK1 |
| WC27 | S3 | S6 | WCK1 |
| WC28 | S0 | S7 | WCK1 |
| WC29 | S1 | S7 | WCK1 |
| WC30 | S2 | S7 | WCK1 |
| WC31 | S3 | S7 | WCK1 |
| WC32 | S0 | S4 | WCK2 |
| WC33 | S1 | S4 | WCK2 |
| WC34 | S2 | S4 | WCK2 |
| WC35 | S3 | S4 | WCK2 |
| WC36 | S0 | S5 | WCK2 |
| WC37 | S1 | S5 | WCK2 |
| WC38 | S2 | S5 | WCK2 |
| WC39 | S3 | S5 | WCK2 |
| WC40 | S0 | S6 | WCK2 |
| WC41 | S1 | S6 | WCK2 |
| WC42 | S2 | S6 | WCK2 |
| WC43 | S3 | S6 | WCK2 |
| WC44 | S0 | S7 | WCK2 |
| WC45 | S1 | S7 | WCK2 |
| WC46 | S2 | S7 | WCK2 |
| WC47 | S3 | S7 | WCK2 |
| WC48 | S0 | S4 | WCK3 |
| WC49 | S1 | S4 | WCK3 |
| WC50 | S2 | S4 | WCK3 |
| WC51 | S3 | S4 | WCK3 |
| WC52 | S0 | S5 | WCK3 |
| WC53 | S1 | S5 | WCK3 |
| WC54 | S2 | S5 | WCK3 |
| WC55 | S3 | S5 | WCK3 |
| WC56 | S0 | S6 | WCK3 |
| WC57 | S1 | S6 | WCK3 |
| WC58 | S2 | S6 | WCK3 |
| WC59 | S3 | S6 | WCK3 |
| WC60 | S0 | S7 | WCK3 |
| WC61 | S1 | S7 | WCK3 |
| WC62 | S2 | S7 | WCK3 |
| WC63 | S3 | S7 | WCK3 |

Figure 13:
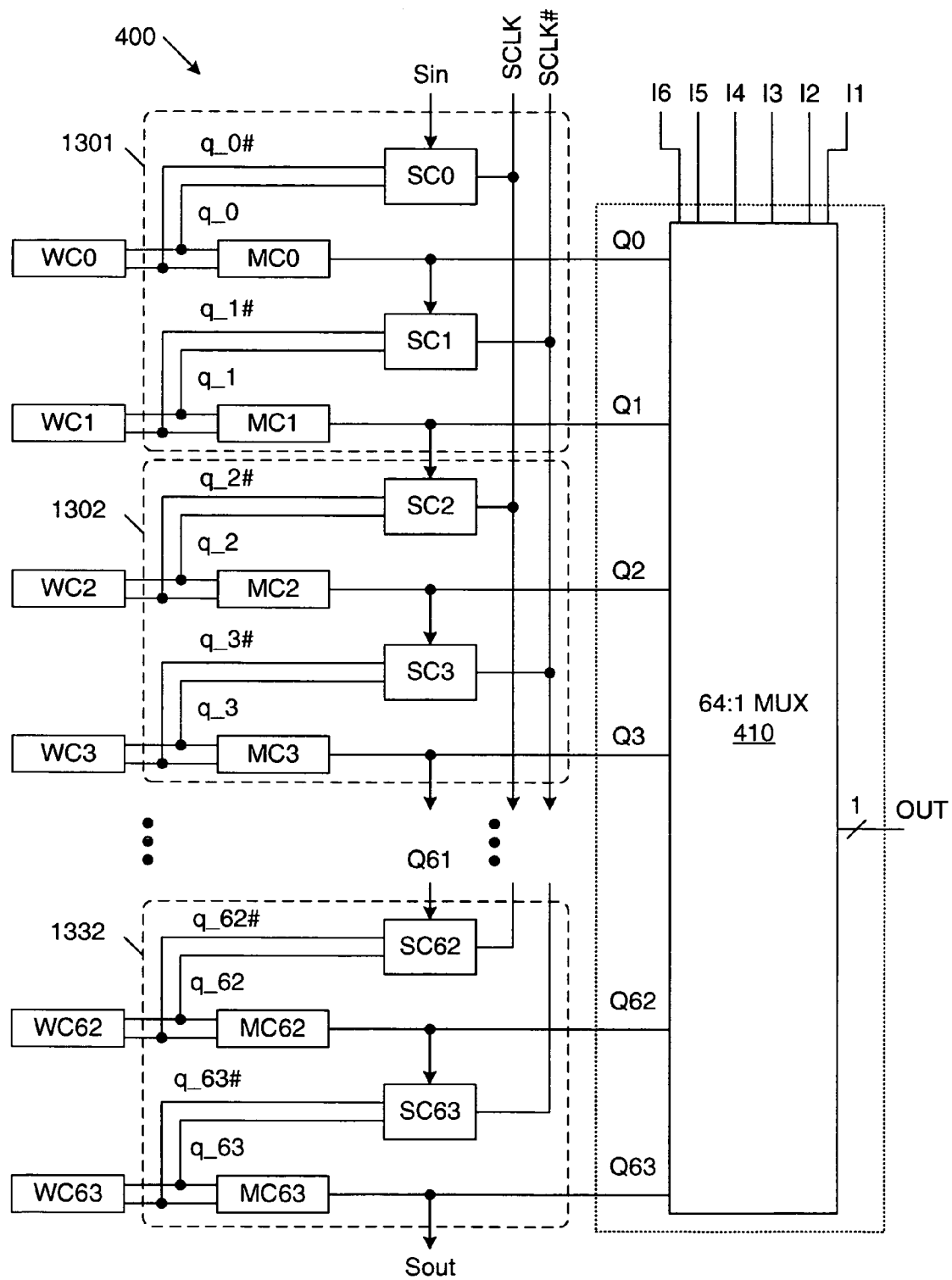
FIG. 13 is a block diagram illustrating the 6-input LUT of FIG. 4 with associated shift control circuits in accordance with one embodiment of the present invention.

FIG. 13 is a block diagram illustrating 6-input LUT 400 with shift control circuits SC0–SC63 added. In another embodiment, 64:1 multiplexer 410 can be replaced with the 64:1 multiplexer 610 of FIG. 6. Each of shift control circuits SC0–SC63 is coupled to a corresponding memory circuit MC0–MC63, respectively. Note that the write decoders, the write control signals, the write clock signals, and the write data signals associated with write control circuits WC0–WC63 and memory circuits MC0–MC63 (FIGS. 8–12) are not shown in FIG. 13 for the purpose of clarity. However, it is understood that these elements are still present in 6-input LUT 400. A shifted input data value Sin is applied to shift control circuit SC0. As described in more detail below, this shifted input data signal Sin is shifted into memory circuits MC0 and MC1 during one cycle of an applied shift clock signal SCLK. In general, adjacent pairs of memory circuits and shift control circuits combine to form a shift register cell. For example, memory circuits MC0–MC1 and shift control circuits SC0–SC1 form shift register cell 1301, and memory circuits MC2–MC3 and shift control circuits SC2–SC3 form shift register cell 1302. There are thirty-two shift register cells 1301–1332 in the illustrated 6-input LUT 400.

Figure 14:
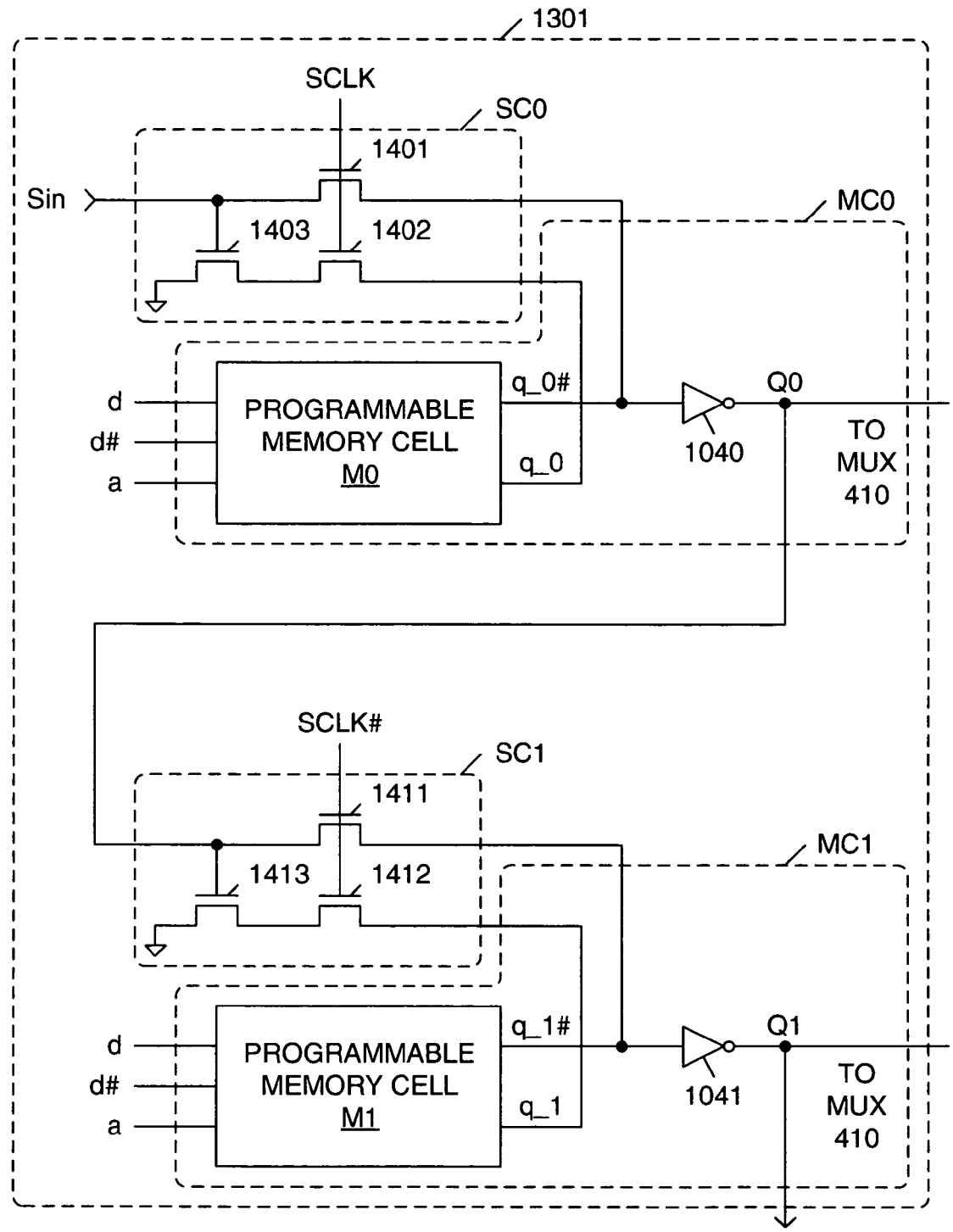
FIG. 14 is a circuit diagram illustrating an even-numbered shift control circuit and an associated even-numbered memory circuit, along with an odd-numbered shift control circuit and an associated odd-numbered memory circuit, in accordance with one embodiment of the present invention.

FIG. 14 is a circuit diagram illustrating shift register cell 1301 (including even-numbered shift control circuit SC0, memory circuit MC0, odd-numbered shift control circuit SC1 and memory circuit MC1), in accordance with one embodiment of the present invention. The other shift register cells 1302–1332 have the same layout illustrated in FIG. 14. Shift control circuit SC0 includes n-channel CMOS transistors 1401–1403, and shift control circuit SC1 includes n-channel CMOS transistors 1411–1413.

Shift control circuit SC0 is configured to receive the shifted data value Sin. The shifted data value Sin can be provided, for example, by an adjacent LUT. During a first half cycle of the shift clock signal SCLK (e.g., when the SCLK signal is high), transistors 1401–1402 are turned on, such that shift control circuit SC0 routes the shifted data value Sin to the associated memory cell M0, as data signals q_0 and q_0#. Transistor 1403 helps to pull down the q_0 signal when the shifted data value Sin has a logic high state. As a result, memory cell M0 stores a data value that is the inverse of the Sin data value. Memory circuit MC0 provides this data value as the Q0 data value (via inverter 1040). In addition, memory cell M0 provides the data signal Q0 to the adjacent shift control circuit SC1.

During a second half cycle of the shift clock signal (e.g., when the SCLK# signal is high), transistors 1411–1412 are turned on, such that shift control circuit SC1 routes the data signal Q0 to the associated memory cell Ml, as data signals q_1 and q_1#. Transistor 1413 helps to pull down the q_1 signal when the data signal Q0 has a logic high state. As a result, memory cell M1 stores a data value that is equal to the Sin data value. Memory circuit MC1 provides this data value as the Q1 data value (via inverter 1041). In addition, memory cell M1 provides the data signal Q1 to the adjacent shift control circuit SC2.

In the foregoing manner, memory cell M0 operates as a master latch and memory cell M1 operates as a slave latch to store the shifted data value Sin. As the shift clock signal SCLK continues to transition, the shifted data value Sin propagates through the 32 shift register cells 1301–1332. Note that multiplexer 410 can be controlled to provide the shifted data value Sin from memory cell M1 or the inverse of the shifted data value (Sin#) from memory cell M0.

Advantageously, each of the shift control circuits SC0–SC63 only requires three n-channel CMOS pass transistors. Because the even-numbered memory cells are used as slave latches, the shift control circuits SC0–SC63 do not an additional pass transistor, similar to pass transistor 310 of the shift control circuit 302 of 4-input LUT 100.

Thus, the 64 available memory cells M0–M63 provide 32 master-slave latch combinations. This results in a 32-bit shift register. The additional cost in moving from the 4-input LUT to the 6-input LUT is therefore reduced. Other solutions for the 6-input LUT shift register, which may be more costly in terms of layout area, include the following. The same shift control circuit illustrated in FIG. 3 can be used to implement a 64-bit shift register in 6-input LUT 400. Alternately, the same shift control circuit illustrated in FIG. 3 can be used to implement a smaller (e.g., 32-bit or 16-bit) shift register in 6-input LUT 400. In this embodiment, only a subset of the memory cells in 6-input LUT 400 are provided with the associated shift register circuitry.

The shift register circuitry can advantageously be used to reprogram 6-input LUT 400 during run time, by serially loading 32 new values into memory circuits MC0–MC63 through the shift register circuitry. As a result, the 6-input LUT can be reprogrammed to implement any 5-input function.

Although the invention has been described in connection with several embodiments, it is understood that this invention is not limited to the embodiments disclosed, but is capable of various modifications, which would be apparent to a person skilled in the art. Thus, the invention is limited only by the following claims.

We claim:

1. A six-input look-up table architecture comprising:
   sixty-four memory cells adapted to store sixty-four corresponding data values;
   a 64:1 multiplexer having input terminals coupled to receive the sixty-four data values from the sixty-four memory cells;
   six input lines providing six input signals and coupled to corresponding control terminals of the 64:1 multiplexer, wherein the 64:1 multiplexer is configured to asynchronously read any one of the sixty-four data values as an output value in response to the six input signals;
   sixty-four write control circuits, each coupled to a corresponding one of the sixty-four memory cells, and each coupled to receive a write data value;
   a first write address decoder coupled to receive a first subset of the six input signals, and in response, provide a first set of write select signals to the sixty-four write control circuits; and
   a second write address decoder coupled to receive a second subset of the six input signals and a write clock signal, and in response, provide a plurality of decoded write clock signals to the sixty-four write control circuits.

2. The six-input look-up table architecture of claim 1, wherein the first write address decoder comprises a 4:16 decoder that provides a set of sixteen write select signals in response to four of the input signals.

3. The six-input look-up table architecture of claim 2, wherein the set of sixteen write select signals are provided to four groups of sixteen write control circuits.

4. The six-input look-up table architecture of claim 1, wherein the second write address decoder comprises:
   a 2:4 decoder coupled to receive two of the input signals, and in response, provide four write clock select signals; and
   four logic gates, each coupled to receive a corresponding one of the four write clock select signals and a write clock signal.

5. The six-input look-up table architecture of claim 4, wherein the four logic gates comprise four 3-input AND gates.

6. The six-input look-up table architecture of claim 4, wherein each of the four logic gates is configured to provide a decoded write clock signal to a subset of the write control circuits.

7. The six-input look-up table architecture of claim 1, wherein one of the sixty-four write control circuits is adapted to route the write data value to the corresponding memory circuit in response to the first set of write select signals and the decoded write clock signals.

8. The six-input look-up table architecture of claim 1, wherein each write control circuit comprises:

a first set of one or more pass transistors, each having a control terminal coupled to receive one of the write select signals of the first set of write select signals from the first write address decoder; and a second set of one or more pass transistors, each having a control terminal coupled to receive one of the decoded write clock signals, wherein the first and second sets of pass transistors are configured to route the write data value to the corresponding memory cell when the received write select signal and the received decoded write clock signal are activated.

9. The six-input look-up table architecture of claim 1, wherein the first write address decoder comprises:

a first 2:4 decoder coupled to receive two of the six input signals, and in response, provide a first subset of the first set of write select signals; and a second 2:4 decoder coupled to receive two of the six input signal, and in response, provide a second subset of first set of write select signals.

10. The six-input look-up table architecture of claim 9, wherein each of the write control circuits is coupled to receive one write select signal from the first subset and one write select signal from the second subset.

11. The six-input look-up table architecture of claim 9, wherein each write control circuit comprises:

a first set of one or more pass transistors, each having a control terminal coupled to receive one of the write select signals of the first subset;

a second set of one or more pass transistors, each having a control terminal coupled to receive one of the write select signals of the second subset; and a third set of one or more pass transistors, each having a control terminal coupled to receive one of the decoded write clock signals, wherein the first, second and third sets of pass transistors are configured to route the write data value to the corresponding memory cell when the received write select signals and the received decoded write clock signal are activated.

\* \* \* \* \*